(12) United States Patent
Inaba et al.

(10) Patent No.: US 9,006,579 B2
(45) Date of Patent: Apr. 14, 2015

(54) METHOD OF MANUFACTURING PRINTED CIRCUIT BOARD AND PRINTED CIRCUIT BOARD

(75) Inventors: Masatoshi Inaba, Sakura (JP); Hiroshi Miyata, Sakura (JP); Hirohito Watanabe, Sakura (JP)

(73) Assignee: Fujikura Ltd., Tokyo (JP)

( * ) Notice: Subject to any disclaimer, the term of this patent is extended or adjusted under 35 U.S.C. 154(b) by 259 days.

(21) Appl. No.: 13/617,366

(22) Filed: Sep. 14, 2012

(65) Prior Publication Data

US 2013/0087370 A1 Apr. 11, 2013

(30) Foreign Application Priority Data

Oct. 11, 2011 (JP) .................................. 2011-223754

(51) Int. Cl.
| | |
|---|---|
| *B32B 38/10* | (2006.01) |
| *H05K 1/00* | (2006.01) |
| *H05K 3/24* | (2006.01) |
| *H05K 3/26* | (2006.01) |
| *H05K 1/11* | (2006.01) |

(52) U.S. Cl.
CPC ................ *H05K 3/244* (2013.01); *H05K 1/118* (2013.01); *H05K 3/26* (2013.01)

(58) Field of Classification Search
CPC .................................. B32B 38/10; H05K 1/00
USPC .......................................... 174/254; 156/153
See application file for complete search history.

(56) References Cited

U.S. PATENT DOCUMENTS

| | | |
|---|---|---|
| 2010/0051325 A1 | 3/2010 | Sato et al. |
| 2011/0132643 A1 | 6/2011 | Hattori et al. |
| 2012/0211465 A1 | 8/2012 | Sato et al. |
| 2014/0254114 A1 | 9/2014 | Hattori et al. |

FOREIGN PATENT DOCUMENTS

| | | |
|---|---|---|
| CN | 101518163 A | 8/2009 |
| CN | 102077698 A | 5/2011 |
| JP | 10-058302 A | 3/1998 |
| JP | 2008-159908 A | 7/2008 |
| JP | 2008-208400 A | 9/2008 |
| JP | 2010-019730 A | 1/2010 |
| JP | 2010-034541 A | 2/2010 |

OTHER PUBLICATIONS

Office Action issued by Japanese Patent Office in Japanese Application No. 2011-223754 dated May 28, 2013.
Office Action issued by Japanese Patent Office in Japanese Patent Application No. 2011-223754 mailed Feb. 4, 2014.
Office Action issued by Japanese Patent Office in Japanese Application No. 2010-034541 mailed Oct. 28, 2014.
Communication dated Nov. 3, 2014, issued by the State Intellectual Property Office of P.R. China in counterpart Chinese application No. 201210369344.0.

*Primary Examiner* — Timothy Thompson
*Assistant Examiner* — Charles Pizzuto
(74) *Attorney, Agent, or Firm* — Sughrue Mion, PLLC

(57) ABSTRACT

A method of manufacturing a printed circuit board includes: forming a copper layer of an interconnection pattern on a base film; laminating a cover lay on the base film so as to expose a part of the copper layer from the cover lay and cover the copper layer by the cover lay; mechanically polishing at least the exposed portion of the copper layer; and performing a plating process on the exposed portion of the copper layer so as to form a plated layer on the copper layer, and the angles $\alpha_1$ and $\alpha_2$ between the polishing direction of the exposed portion of the copper layer and the bending lines $C_1$ and $C_2$ satisfy the following formula (1):

$$30° \leq \alpha_1 \text{ and } \alpha_2 \leq 150° \qquad (1).$$

3 Claims, 10 Drawing Sheets

METHOD OF MANUFACTURING PRINTED CIRCUIT BOARD AND PRINTED CIRCUIT BOARD

BACKGROUND OF THE INVENTION

1. Field of the Invention

The present invention relates to a method of manufacturing a printed circuit board which includes a terminal portion and is to be bent with a small bending radius and to the printed circuit board.

The present application claims priority from Japanese Patent Application No. 2011-223754, filed on Oct. 11, 2011. The contents described and/or illustrated in the documents relevant to the Japanese Patent Application No. 2011-223754 will be incorporated herein by reference as a part of the description and/or drawings of the present application.

2. Description of the Related Art

There is a known technique which performs a buffing process on a surface of an interconnection terminal portion in order to remove an oxide film, an organic substance, or the like before a plating process is performed on the interconnection terminal portion which is fitted to another printed circuit board or the like through a connector (for example, see JP 2008-208400 A).

SUMMARY OF THE INVENTION

In the above-described technique, since a portion other than the terminal portion in the printed circuit board is polished, plural polishing flaws are also formed on a surface of a cover lay which is laminated on the interconnection pattern.

When the flexible printed circuit board is bent so that the radius further decreases, a crack progresses from the polishing flaws serving as origins at the time of bending, which causes a problem that the flexible printed circuit board is broken.

It is an object of the invention to provide a method of manufacturing a printed circuit board and a printed circuit board capable of preventing the breakage even when a bending radius is small.

[1] A present invention is a method of manufacturing a printed circuit board which is to be bent about a bending line, the method including: forming a conductor layer of an interconnection pattern on an insulating layer; laminating a covering layer on the insulating layer so as to expose a part of the conductor layer from the covering layer and cover the conductor layer by the covering layer; mechanically polishing at least the exposed portion of the conductor layer; and performing a plating process on the exposed portion of the conductor layer so as to form a plated layer on the conductor layer, wherein an angle ($\alpha$) between the polishing direction of the exposed portion of the conductor layer and the bending line satisfies the following formula (1).

$$30° \leq \alpha \leq 150° \quad (1)$$

[2] In the method of manufacturing the printed circuit board, the printed circuit board may include a plurality of bending lines, and the polishing direction of the exposed portion of the covering layer may satisfy the formula (1) with respect to all bending lines.

[3] A present invention is a printed circuit board which is to be bent about a bending line, the printed circuit board including: an insulating layer; an interconnection pattern which is formed on the insulating layer and includes a terminal portion; and a covering layer which is laminated on the insulating layer so as to expose the terminal portion and cover the interconnection pattern, wherein a plurality of polishing flaws are formed on the surface of the covering layer, and an angle ($\beta$) between the polishing flaws and the bending line satisfies the following formula (2).

$$30° \leq \beta \leq 150° \quad (2)$$

According to the present invention, since the angle ($\alpha$) between the polishing direction and the bending line is 30° to 150° when the exposed portion of the conductor layer is mechanically polished, the polishing flaws formed on the covering layer are also inclined with respect to the bending line by the angle of 30° to 150°. For this reason, since it is possible to prevent the crack from progressing from the polishing flaws serving as origins when the printed circuit board is bent about the bending line, it is possible to prevent the printed circuit board from being broken even when the bending radius is small.

Further, according to the present invention, since the angle ($\beta$) between the bending line and the polishing flaws on the covering layer is 30° to 150°, it is possible to prevent the crack from progressing from the polishing flaws serving as origins when the printed circuit board is bent about the bending line and hence to prevent the printed circuit board from being broken even when the bending radius is small.

BRIEF DESCRIPTION OF THE DRAWINGS

FIG. 5A is a diagram illustrating a state before the printed circuit board is bent and FIG. 5B is a diagram illustrating a state after the printed circuit board is bent.

FIG. 8A is a diagram illustrating step S10 of FIG. 7, FIG. 8B is a diagram illustrating step S20 of FIG. 7, FIG. 8C is a diagram illustrating step S30 of FIG. 7, and FIG. 8D is a diagram illustrating step S60 of FIG. 7.

DETAILED DESCRIPTION OF THE PREFERRED EMBODIMENTS

Hereinafter, an embodiment of the present invention will be described with reference to the drawings.

Figure 1:
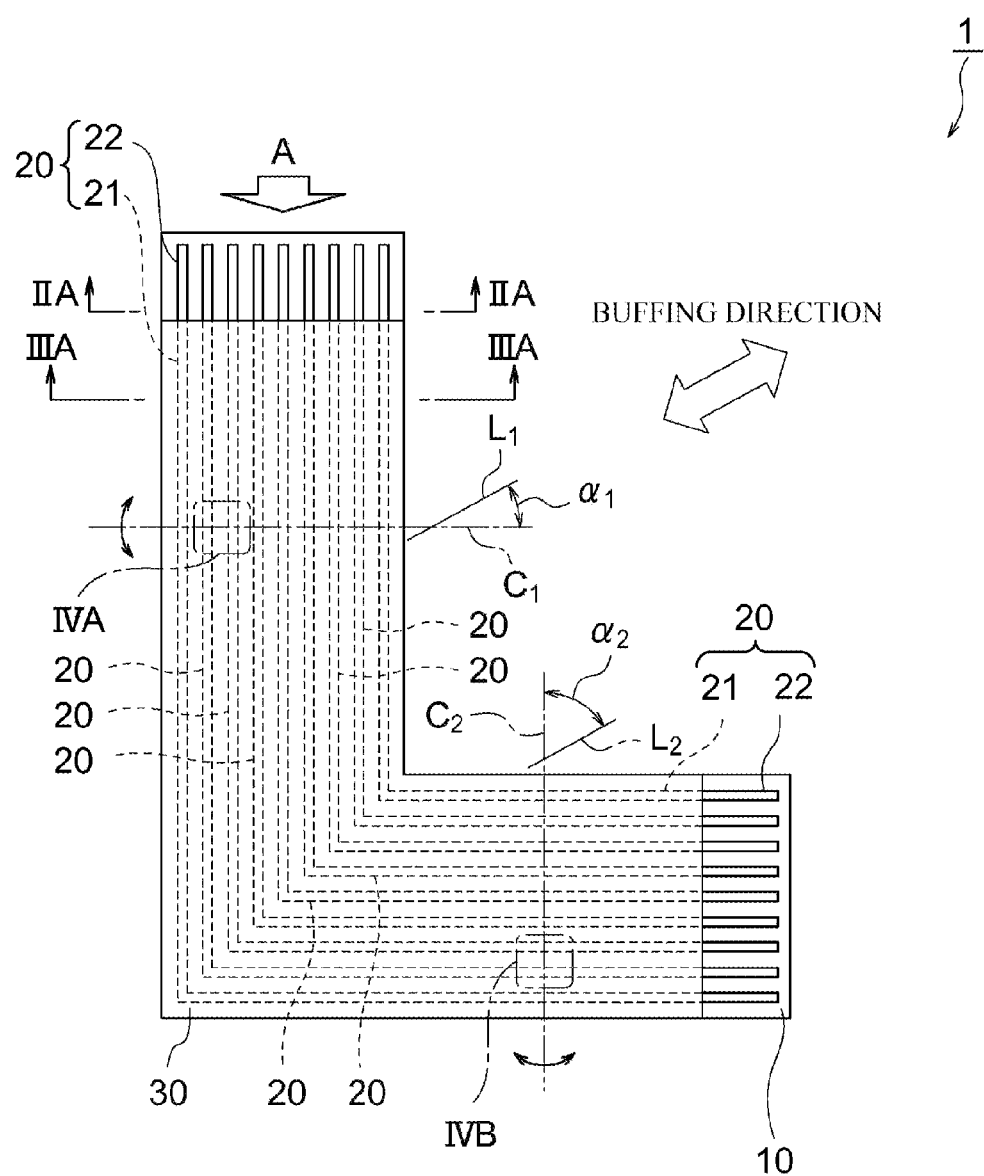
FIG. 1 is a plan view illustrating a printed circuit board in an embodiment of the present invention.
Figure 2A:
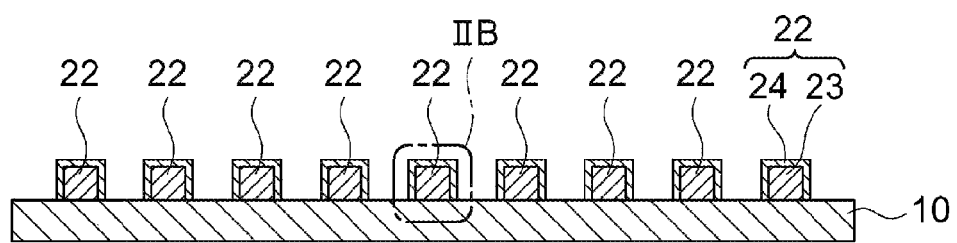
FIG. 2A is a cross-sectional view along the line IIA-IIA of FIG. 1.
Figure 2B:
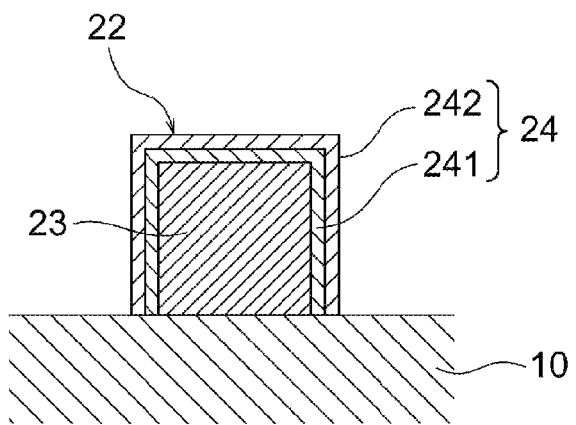
FIG. 2B is an enlarged view of a part IIB of FIG. 2A.
Figure 3A:
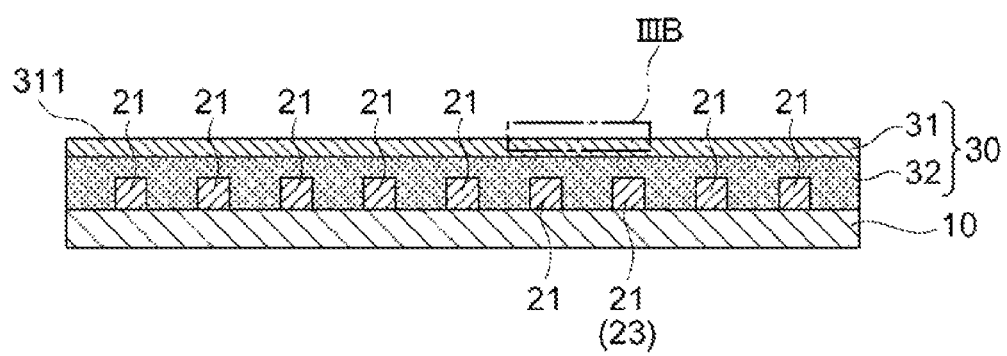
FIG. 3A is a cross-sectional view along the line IIIA-IIIA of FIG. 1.
Figure 3B:
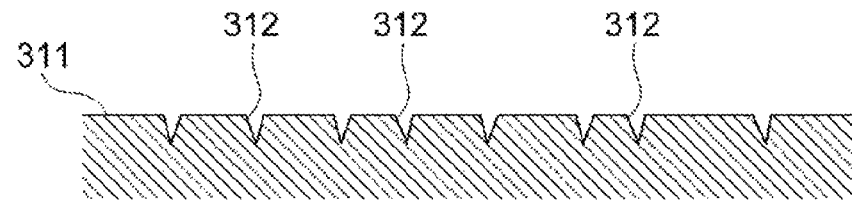
FIG. 3B is an enlarged view of a part IIIB of FIG. 3A.
Figure 4A:
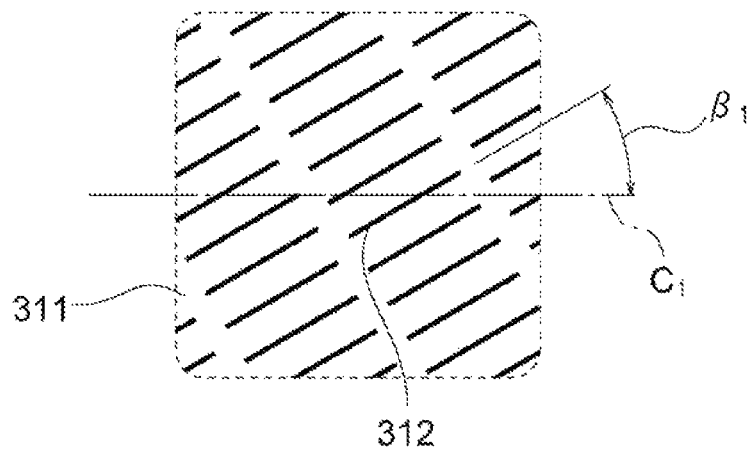
FIG. 4A is an enlarged view of a part IVA of FIG. 1.
Figure 4B:
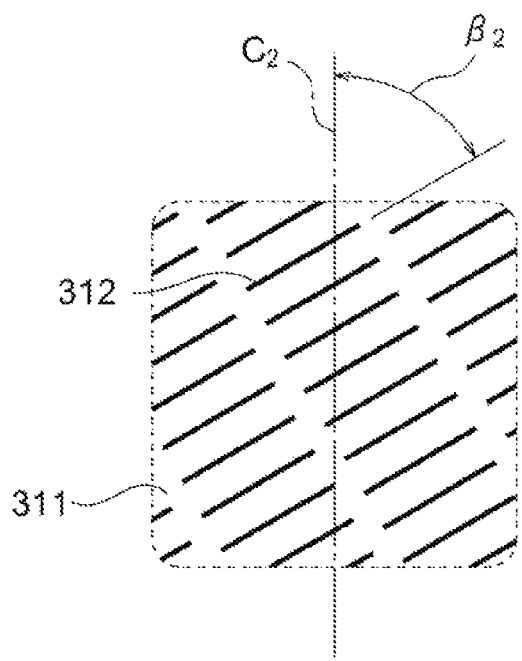
FIG. 4B is an enlarged view of a part IVB of FIG. 1.

FIG. 1 is a plan view illustrating a printed circuit board in the present embodiment, FIG. 2A is a cross-sectional view along the line IIA-IIA of FIG. 1, FIG. 2B is an enlarged view of a part IIB of FIG. 2A, FIG. 3A is a cross-sectional view along the line IIIA-IIIA of FIG. 1, FIG. 3B is an enlarged view of a part IIIB of FIG. 3A, FIG. 4A is an enlarged view of a part IVA of FIG. 1, and FIG. 4B is an enlarged view of a part IVB of FIG. 1.

A printed circuit board 1 of the embodiment is, for example, a flexible printed circuit board (FPC) which is assembled to an electronic apparatus such as a cellular phone, a personal digital assistant (PDA), a smart phone, a notebook computer, a tablet-type information terminal, a digital camera, a digital video camera, and a digital audio player. As illustrated in FIGS. 1 to 3B, the printed circuit board 1 includes a base film 10, an interconnection pattern 20, and a cover lay 30 and has an L-shape as a whole. Note that, the plane shape of the printed circuit board is not particularly limited thereto, and an arbitrary shape may be selected.

The base film 10 is, for example, a flexible insulating film which is formed of polyimide (PI). Note that, the base film 10 may be formed of, for example, liquid crystal polymer (LCP), polyethylene terephthalate (PET), polyethylene naphthalate (PEN), polyester (PE), or aramid. The base film 10 of the embodiment is equivalent to an example of the insulating layer of the present invention.

Plural interconnection patterns 20 are formed on the base film 10. In the embodiment, as illustrated in FIG. 1, plural interconnection patterns 20 are arranged in parallel at the same interval and extend in an L-shape on the base film 10. Note that, the shape, the arrangement, and the like of the interconnection patterns 20 are not particularly limited. Further, the interconnection patterns may be formed on both surfaces of the base film 10 or the interconnection patterns may include via-holes and the like.

Terminal portions 22 are respectively provided at both ends of each interconnection pattern 20. The terminal portion 22 is connected with, for example, a connector which is provided in another printed circuit board, a cable, or the like, and the printed circuit board 1 is connected to an external electronic circuit through the terminal portion 22. Note that, the position where the terminal portion is formed is not limited to the end portion of the interconnection pattern, and an arbitrary position in the interconnection pattern may be selected. Further, the number of the terminal portions in the interconnection pattern is not particularly limited.

A portion 21 (hereinafter, simply referred to as an interconnection portion 21) other than the terminal portion 22 in the interconnection pattern 20 is formed, for example, by etching a copper foil laminated on the base film 10, and is only formed of a copper layer 23 as illustrated in FIG. 3A. On the other hand, as illustrated in FIG. 2A, the terminal portion 22 of the interconnection pattern 20 includes: a copper layer 23 which extends from the interconnection portion 21; and a plated layer 24 which is formed on the surface of the copper layer 23 by an electrolytic plating process.

As illustrated in FIG. 2B, the plated layer 24 includes: a nickel (Ni) layer 241 as a base; and a gold (Au) layer 242 formed on the surface of the nickel layer 241. The nickel layer 241 serves as a barrier layer which suppresses the spreading of the gold layer 242 to the copper layer 23. Note that, the configuration of the plated layer 24 is not particularly limited to the above-described example. For example, the nickel layer may be omitted, and the gold layer 242 may be directly formed on the copper layer 23. Further, the plated layer 24 may be formed by an electroless plating process.

As illustrated in FIG. 3A, the cover lay 30 includes: a resinous layer 31 which protects the interconnection portion 21 of the interconnection pattern 20; and an adhesive layer 32 which sticks the resinous layer 31 to the base film 10, and is laminated on the base film 10 so as to cover the interconnection portions 21 of the interconnection pattern 20 as illustrated in FIG. 1. On the other hand, as illustrated in the same drawing, the terminal portions 22 of the interconnection pattern 20 expose from the cover lay 30. The cover lay 30 of the embodiment is equivalent to an example of the covering layer of the present invention.

The resinous layer 31 of the cover lay 30 is, for example, a flexible insulating substrate formed of polyimide (PI). Note that, the resinous layer may be formed of, for example, liquid crystal polymer (LCP), polyethylene terephthalate (PET), polyethylene naphthalate (PEN), polyester (PE), or aramid.

On the other hand, the adhesive layer 32 of the cover lay 30 is formed of, for example, an epoxy adhesive or an acrylic adhesive. Note that, when the base film 10 is formed of liquid crystal polymer (LCP) and the resinous layer 31 of the cover lay 30 is also formed of liquid crystal polymer (LCP), these may be stuck to each other by thermal fusion bonding, and hence the adhesive layer 32 is not needed.

Note that, the cover lay 30 may be formed as, for example, a dry film which is formed of a photosensitive cover lay material using polyester, epoxy, acryl, polyimide, polyurethane, and the like. Alternatively, the cover lay 30 may be formed by screen-printing a cover lay ink based on polyimide or epoxy or a liquid photosensitive cover lay material on the base film 10.

As illustrated in FIG. 1, the printed circuit board 1 of the embodiment is assembled to, for example, an electronic apparatus while being bent at the bending radius 0.3 [mm] or less about a first bending line $C_1$ and being bent at the bending radius 0.3 [mm] or less about a second bending line $C_2$. In addition, the printed circuit board 1 of the embodiment is not assembled to a repeatedly bent movable portion of an electronic apparatus, but is permanently assembled to an electronic apparatus while being bent (plastically deformed) at the minimum bending radius. For this reason, in the printed circuit board 1 of the embodiment, toughness with respect to the minimum bending radius is needed rather than bending durability. Note that, the first and second bending lines $C_1$ and $C_2$ are all imaginary lines. Further, the bending position or the bending radius of the printed circuit board is merely an example, and is not particularly limited thereto.

Incidentally, in the embodiment, as described below, a buffing process is performed on the surface of the copper layer 23 so as to remove foreign matter such as an oxidized substance or an organic substance present on the copper layer 23 before forming the plated layer 24 of the terminal portion 22.

In the buffing process, a surface 311 of the resinous layer 31 of the cover lay 30 is also exposed to buffing. For this reason, as illustrated in FIG. 3B, plural polishing flaws 312 having a depth of 1 [μm] or more are formed on the surface 311 of the resinous layer 31. As illustrated in FIGS. 4A and 4B, these polishing flaws 312 are arranged on the cover lay 30 so as to satisfy the following formulae (3) and (4).

$$30° \leq \beta_1 \leq 150° \qquad (3)$$

$$30° \leq \beta_2 \leq 150° \qquad (4)$$

Here, in the formula (3), $\beta_1$ is an angle of the polishing flaw 312 with respect to the first bending line $C_1$, and in the formula (4), $\beta_2$ is an angle of the polishing flaw 312 with respect to the second bending line $C_2$. Note that, FIGS. 4A and 4B are schematic diagrams illustrating the directions of the polishing flaws 312, and in fact, the length, the width, the interval, and the like of the polishing flaws 312 are random.

Figure 5A:
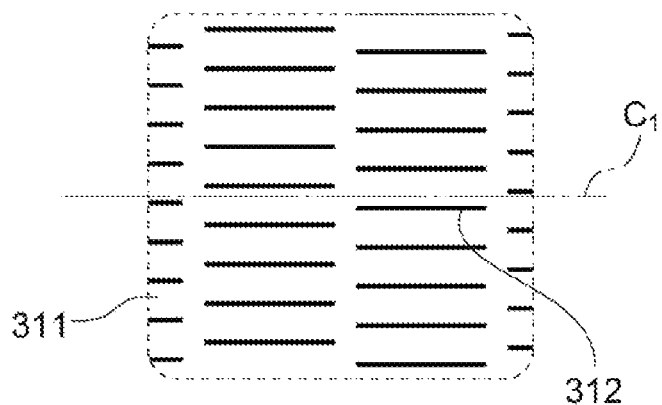
FIGS. 5A and 5B are enlarged views of a cover lay having polishing flaws parallel to a bending line, where
Figure 5B:
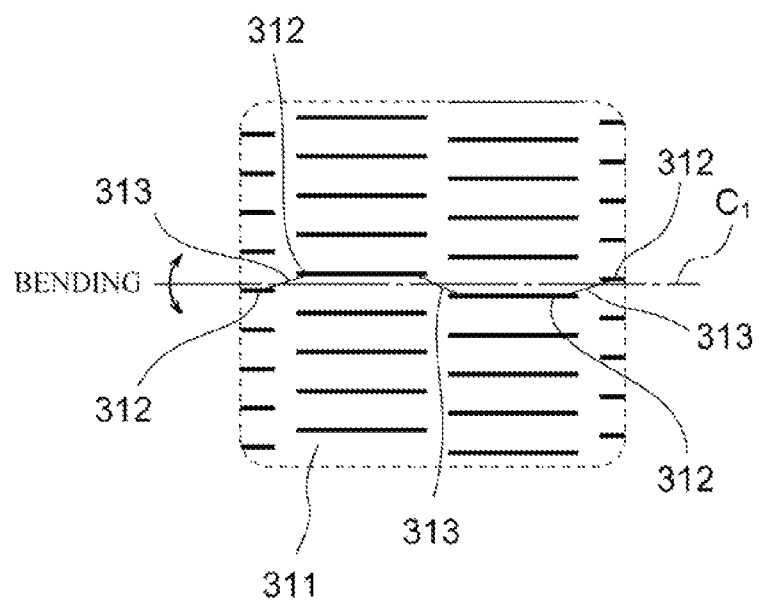

FIGS. 5A and 5B are enlarged views of the cover lay which includes polishing flaws parallel to the bending line, and FIG.

6 is an enlarged view of the surface of the cover lay in a state where the printed circuit board of the embodiment is bent.

When bending the printed circuit board in which the polishing flaws 312 are formed in parallel to the bending line C₁ (see FIG. 5A), the portion provided with the polishing flaws 312 in the cover lay 30 is thinned, so that a stress concentrates on the portion and the polishing flaws 312 are torn to be opened. Then, as illustrated in FIG. 5B, tears 313 which progress from the polishing flaws 312 are propagated to the peripheral polishing flaws 312, so that the polishing flaws 312 near the bending line C1 are sequentially connected to each other and a large crack is formed. As a result, the printed circuit board may be broken.

Figure 6:
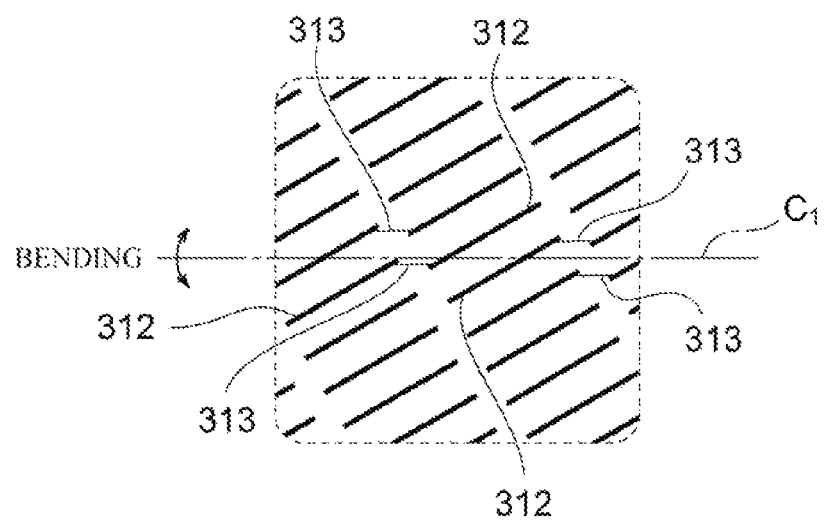
FIG. 6 is an enlarged view of the surface of the cover lay in a state where the printed circuit board in the embodiment of the present invention is bent, and is a diagram which corresponds to FIG. 4A.

Here, in the embodiment, the polishing flaws 312 are formed on the cover lay 30 so as to satisfy the formulae (3) and (4), but the tears 313 which accompany the bending of the printed circuit board 1 are formed only in the vicinity of the bending line $C_1$. For this reason, as illustrated in FIG. 6, the number of the polishing flaws 312 which are connected to each other through the tears 313 drastically decreases. For this reason, since it is possible to prevent the crack from progressing from the polishing flaws serving as origins, it is possible to prevent the printed circuit board from being broken even when the bending radius is small.

Hereinafter, a method of manufacturing a printed circuit board in the embodiment will be described by referring to FIGS. 7 and 8.

Figure 7:
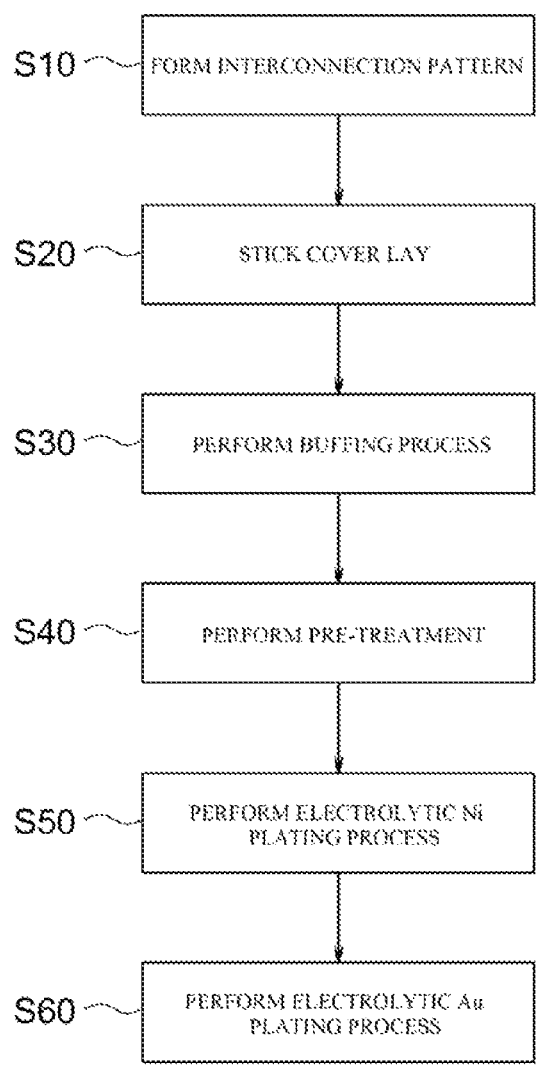
FIG. 7 is a flowchart illustrating a method of manufacturing a printed circuit board in the embodiment of the present invention.

FIG. 7 is a flowchart illustrating a method of manufacturing a printed circuit board, and FIGS. 8A to 8D are side views illustrating the printed circuit board in the respective steps. Note that, FIGS. 8A to 8D are side views illustrating the printed circuit board 1 when seen from the direction A of FIG. 1.

Figure 8A:
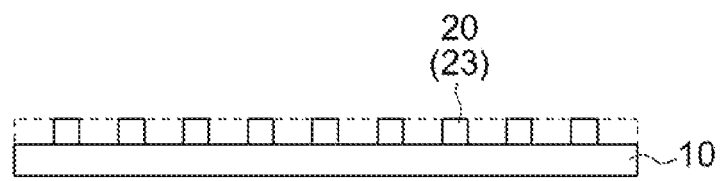
FIGS. 8A to 8D are side views illustrating the printed circuit board in the respective steps of FIG. 7, where

First, in step S10 of FIG. 7, as illustrated in FIG. 8A, the interconnection patterns 20 are formed on the base film 10 by a subtractive method. Specifically, a resist pattern is formed on a copper foil of a copper-clad laminate (CCL) by using a mask having a shape corresponding to the interconnection pattern 20, and an etching process is performed on the copper foil by using an iron chloride etching solution, a copper chloride etching solution, or an alkali etchant. Accordingly, the interconnection portions 21 of the interconnection patterns 20 are formed on the base film 10. Note that, concerning the terminal portion 22, only the copper layer 23 is formed in step S10. The copper layer 23 of the embodiment is equivalent to an example of the conductor layer of the present invention.

Note that, the method of forming the interconnection pattern 20 is not particularly limited to the above-described example. For example, as in the semi-additive method, the interconnection pattern may be formed by a plating process. Alternatively, the interconnection pattern may be formed by screen-printing a conductive paste, such as a silver paste or a copper paste, on a base film.

Figure 8B:
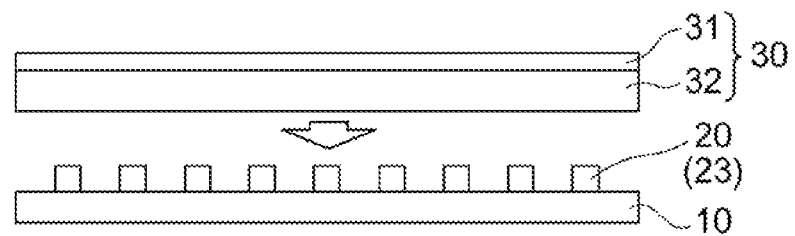

Subsequently, in step S20 of FIG. 7, the cover lay 30 is laminated on the base film 10 and these are heated and pressurized by hot pressing as illustrated in FIG. 8B, so that the cover lay 30 is stuck to the base film 10. At this time, all of the interconnection portions 21 of the interconnection patterns 20 are covered by the cover lay 30, but the copper layers 23 in the terminal portions 22 of the interconnection patterns 20 are exposed from the cover lay 30.

Figure 8C:
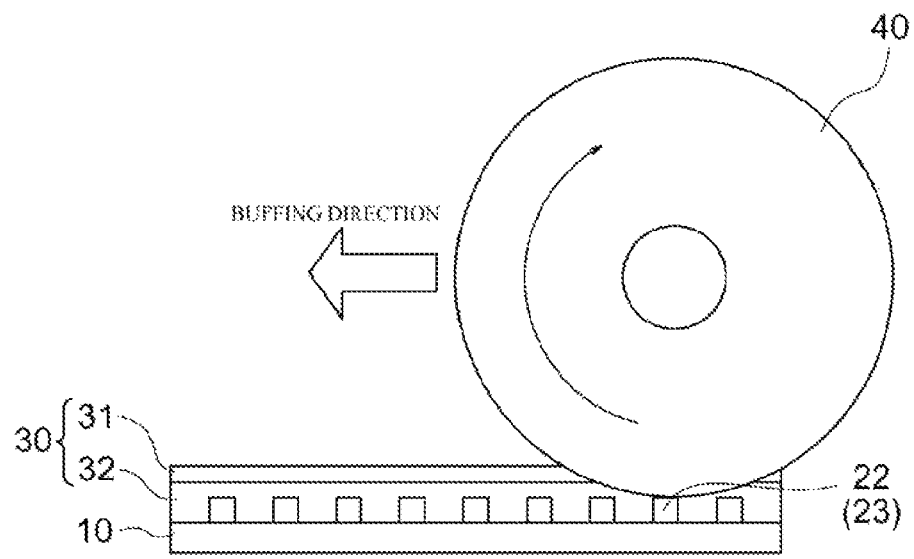

Subsequently, in step S30 of FIG. 7, as illustrated in FIG. 8C, a buff roll 40 of a buffing machine is rotated and is moved relative to the printed circuit board, and the surfaces of the copper layers 23 of the terminal portions 22 of the interconnection patterns 20 are polished, so that foreign matter such as an oxidized substance or an organic substance present on the copper layer 23 is removed. In the buffing process, not only the terminal portions 22 but also the surface 311 of the resinous layer 31 of the cover lay 30 are polished by the buff roll 40 of the buffing machine, so that polishing flaws (see FIG. 3B) having a depth of 1 [μm] or more are formed on the surface 311 of the resinous layer 31.

In the embodiment, in step S30, the buffing process is performed so that the buffing direction satisfies the following formulae (5) and (6).

$$30° \leq \alpha_1 \leq 150°$$ (5)

$$30° \leq \alpha_2 \leq 150°$$ (6)

Here, in the formula (5), $\alpha_1$ is an angle of the buffing direction (indicated by the reference numeral $L_1$ of FIG. 1) with respect to the first bending line $C_1$, and in the formula (6), $\alpha_2$ is an angle of the buffing direction (indicated by the reference numeral $L_2$ of FIG. 1) with respect to the second bending line $C_2$ (see FIG. 1). Further, as illustrated in FIG. 8C, the 'buffing direction' of the embodiment is a direction in which the rotating buff roll 40 moves forward (or backward) relative to the printed circuit board 1, and is equivalent to an example of the polishing direction of the invention.

The plural polishing flaws 312 which are formed on the surface 311 of the cover lay 30 by the buffing process are arranged so as to be substantially parallel to the buffing direction and are substantially parallel to each other, and the angles $\beta_1$ and $\beta_2$ of the polishing flaws 312 with respect to the bending lines $C_1$ and $C_2$ satisfy the above-described formulae (3) and (4).

Note that, the buff roll 40 which is used in step S30 is formed by winding a roll with a cloth having an abrasive evenly attached thereto. As the abrasive, for example, diamond particles or ceramics particles such as aluminum oxide ($Al_2O_3$) may be mentioned. Further, as the cloth having the abrasive attached thereto, for example, a nylon cloth, a polypropylene cloth, or the like may be mentioned.

Subsequently, in step S40 of FIG. 7, a pre-treatment is performed on the copper layers 23 in the terminal portions 22 of the interconnection patterns 20. Specifically, first, a degreasing and cleaning process is performed on the copper layers 23 of the terminal portions 22, so that the oil substance on the surfaces of the copper layers 23 is removed. Subsequently, an acid treatment is performed on the copper layers 23 of the terminal portions 22, so that the oxide films on the copper layers 23 are removed. Note that, the content of the pre-treatment in step S40 is merely an example, but is not particularly limited thereto.

Figure 8D:
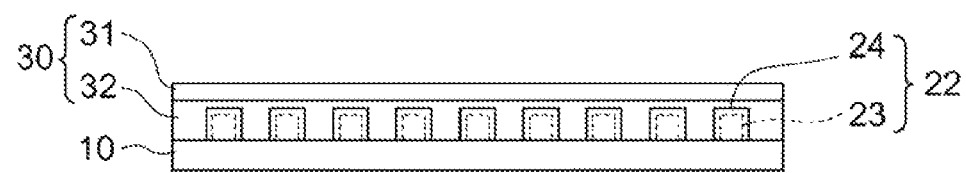

Subsequently, in step S50 of FIG. 7, the nickel layer 241 (see FIG. 2(b)) is formed on the surfaces of the copper layers 23 of the terminal portions 22 by an electrolytic nickel plating process. Subsequently, in step S60 of FIG. 7, the gold layer 242 (see FIG. 2B) is formed on the surface of the nickel layer 241 by an electrolytic gold plating process. Accordingly, as illustrated in FIG. 8D, the plated layers 24 are formed on the copper layers 23, thereby forming the terminal portions 22.

Incidentally, when the surfaces of the copper layers 23 of the terminal portions 22 are not polished in step S30 and a plating process is performed on the copper layers 23 in step S50, there is a case in which the adhesiveness of the boundary face between the copper layer 23 and the plated layer 24 decreases. For this reason, the contact resistance of the terminal portion 22 increases and the abrasion resistance of the terminal portion 22 with respect to the repeated insertion and extraction of the connector degrades.

As described above, in the embodiment, since the buffing direction of step S30 satisfies the above-described formulae (5) and (6), the polishing flaws 312 are formed so as to be inclined with respect to the bending lines $C_1$ and $C_2$ by the above-described angles $\beta_1$ and $\beta_2$. For this reason, since it is possible to prevent the crack from progressing from the polishing flaws 312 serving as origins when the printed circuit board 1 is bent about the bending lines $C_1$ and $C_2$, it is possible to prevent the printed circuit board from being broken even when the bending radius is small.

Note that, step S10 of FIG. 7 of the embodiment is equivalent to an example of "forming a conductor layer" of the present invention, step S20 of FIG. 7 of the embodiment is equivalent to an example of "laminating a covering layer" of the present invention, step S30 of FIG. 7 of the embodiment is equivalent to an example of "mechanically polishing" of the present invention, and step S40 to step S60 of FIG. 7 are equivalent to "performing a plating process" of the present invention.

Furthermore, the above-described embodiment is merely described so as to help the understanding of the invention, and does not limit the invention. Accordingly, the respective components disclosed in the above-described embodiment also include all changes in design or equivalents which are included in the technical scope of the invention.

Hereinafter, the effect of the invention is verified by Examples and Comparative Examples which further specifically illustrate the present invention. Examples and Comparative Examples below are prepared to verify the effect of suppressing the printed circuit board from being broken in the above-described embodiment.

EXAMPLES

Example 1

Figure 9:
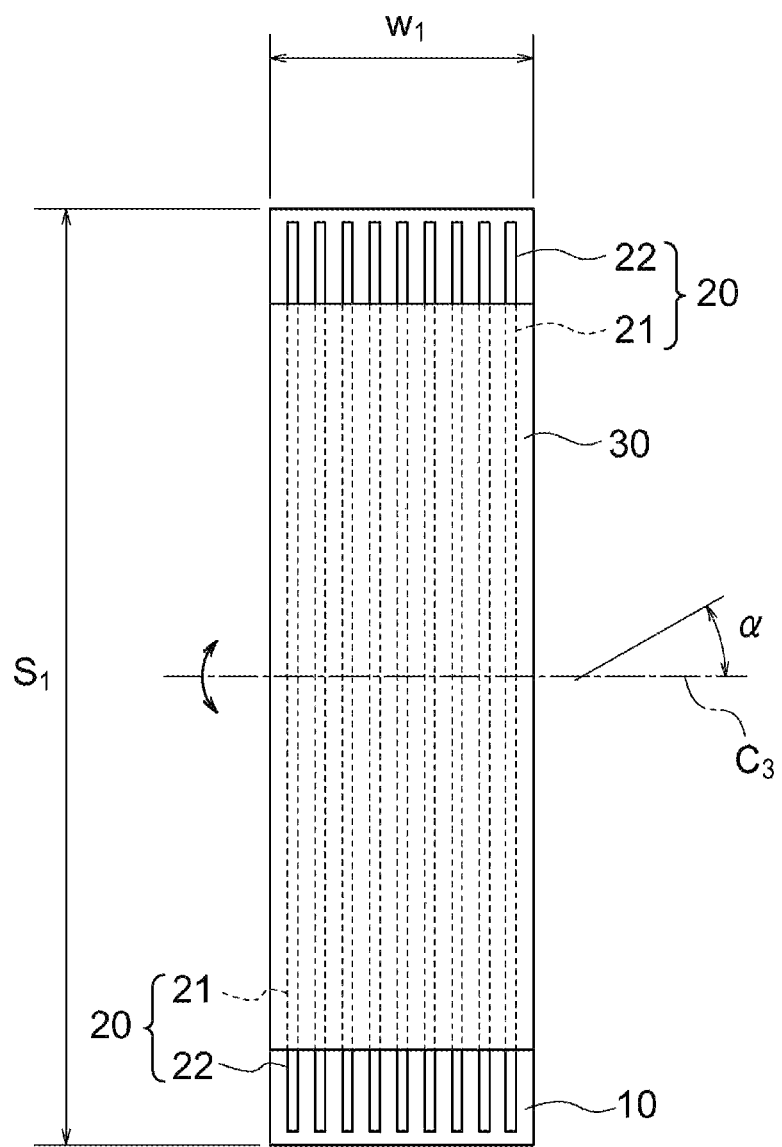
FIG. 9 is a plan view of a sample of Example 1.

In Example 1, ten straight printed circuit boards illustrated in FIG. 9 were prepared as samples. Note that, FIG. 9 is a plan view of a sample of Example 1. In FIG. 9, the same reference numerals are given to the same components as those of the printed circuit board in the above-described embodiment.

Specifically, in Example 1, first, a single-sided copper-clad laminate (CCL) having a strip shape with $S_1$ of 100 [mm] and $w_1$ of 10 [mm] was prepared, the CCL which comprises: a polyimide film (base film) having a thickness of 25 [μm]: and a copper foil on which is laminated and having a thickness of 18 [μm], a resist pattern was formed on the copper foil, and then an etching process was performed on the copper foil so as to form thirty straight interconnection patterns arranged in parallel at the interval of 0.1 [mm]. The width of each interconnection pattern was 0.1 [mm]. Further, as illustrated in the same drawing, a bending line $C_3$ was set to only one position of the center portion of the printed circuit board in the length direction.

Subsequently, a cover lay which was formed by applying a thermosetting adhesive having a thickness of 30 [μm] on a polyimide film having a thickness of 12.5 [μm] was laminated on the base film so that both end portions of the interconnection pattern are respectively exposed by 3 [mm], and was cured for 70 minutes at 165° C. by hot pressing, so that the cover lay was bonded to the base film.

Subsequently, the buffing process was performed on the entire surface of the printed circuit board. At this time, in Example 1, the angle α of the buffing direction with respect to the bending line $C_3$ was set to 90° (that is, the buffing direction was made to be perpendicular to the bending line $C_3$).

In the buffing process, a buff roll formed by attaching aluminum oxide having a particle size of #1000 to a nylon cloth was used, the number of rotations of the buff roll was set to 1450 [rpm], and the transfer speed was set to 1.65 [m/min]. Further, the pressure of the buff roll was set so that a foot mark of 1.5 to 2.0 [mm] was formed.

Ten printed circuit boards prepared as described above were respectively bent manually about the bending line $C_3$ by using a mandrel having a diameter of 0.6 [mm] (bending radius: 0.3 [mm]) once to ten times, and the surface of the cover lay was visually observed by using a microscope.

In the sample of Example 1, as illustrated in Table 1, even when the printed circuit board is bent ten times, no crack occurs on the surface of the cover lay. Note that, in the section of 'presence of breakage' of Table 1, 'O' indicates a state where the printed circuit board is not broken, and 'X' indicates a state where the printed circuit board is broken.

TABLE 1

|  | α | PRESENCE OF BREAKAGE |
| --- | --- | --- |
| EXAMPLE 1 | 90° | O |
| EXAMPLE 2 | 60° | O |
| EXAMPLE 3 | 45° | O |
| EXAMPLE 4 | 30° | O |
| COMPARATIVE EXAMPLE 1 | 15° | X (SEVEN TIMES) |
| COMPARATIVE EXAMPLE 2 | 10° | X (FIVE TIMES) |
| COMPARATIVE EXAMPLE 3 | 0° | X (THREE TIMES) |

Example 2

In Example 2, ten samples were prepared in the same way as those of Example 1 except that the angle α of the buffing direction with respect to the bending line $C_3$ was set to 60°.

Even in the sample of Example 2, ten printed circuit boards were respectively bent about the bending line $C_3$ once to ten times on the same condition as that of Example 1, and the surface of the cover lay of the printed circuit board was observed.

As illustrated in Table 1, even in the sample of Example 2, no crack occurs on the surface of the cover lay even when the printed circuit board is bent ten times.

Example 3

In Example 3, ten samples were prepared in the same way as that of Example 1 except that the angle α of the buffing direction with respect to the bending line $C_3$ was set to 45°.

Even in the sample of Example 3, ten printed circuit boards were respectively bent about the bending line $C_3$ once to ten times on the same condition as that of Example 1, and the surface of the cover lay of the printed circuit board was observed.

As illustrated in Table 1, even in the sample of Example 3, no crack occurs on the surface of the cover lay even when the printed circuit board is bent ten times.

Example 4

In Example 4, ten samples were prepared in the same way as that of Example 1 except that the angle α of the buffing direction with respect to the bending line $C_3$ was set to 30°.

Even in the sample of Example 4, ten printed circuit boards were respectively bent about the bending line $C_3$ once to ten times on the same condition as that of Example 1, and the surface of the cover lay of the printed circuit board was observed.

As illustrated in Table 1, even in the sample of Example 4, no crack occurs on the surface of the cover lay even when the printed circuit board is bent ten times.

Comparative Example 1

In Comparative Example 1, ten samples were prepared in the same way as those of Example 1 except that the angle α of the buffing direction with respect to the bending line $C_3$ was set to 15°.

Even in the sample of Comparative Example 1, ten printed circuit boards were respectively bent about the bending line $C_3$ once to ten times on the same condition as that of Example 1, and the surface of the cover lay of the printed circuit board was observed.

As illustrated in Table 1, in the sample of Comparative Example 1, the adhesive layer and the resinous layer of the cover lay were broken at the time point when the printed circuit board was bent seven times, so that the interconnection pattern was exposed.

Comparative Example 2

In Comparative Example 2, ten samples were prepared in the same way as that of Example 1 except that the angle α of the buffing direction with respect to the bending line $C_3$ was set to 10°.

Even in the sample of Comparative Example 2, ten printed circuit boards were respectively bent about the bending line $C_3$ once to ten times on the same condition as that of Example 1, and the surface of the cover lay of the printed circuit board was observed.

As illustrated in Table 1, in the sample of Comparative Example 2, the adhesive layer and the resinous layer of the cover lay were broken at the time point when the printed circuit board was bent five times, so that the interconnection pattern was exposed.

Comparative Example 3

In Comparative Example 3, ten samples were prepared in the same way as those of Example 1 except that the angle α of the buffing direction with respect to the bending line $C_3$ was set to 0° (that is, the buffing direction was set to be parallel to the bending line $C_3$).

Even in the sample of Comparative Example 3, ten printed circuit boards were respectively bent about the bending line $C_3$ once to ten times on the same condition as that of Example 1, and the surface of the cover lay of the printed circuit board was observed.

As illustrated in Table 1, in the sample of Comparative Example 3, the adhesive layer and the resinous layer of the cover lay were broken at the time point when the printed circuit board was bent three times, so that the interconnection pattern was exposed.

As described above, in Examples 1 to 4 in which the angle α of the buffing direction with respect to the bending line $C_3$ is 30° or more, the crack caused by the bending could be suppressed. On the contrary, in Comparative Examples 1 to 3 in which the angle α of the buffing direction with respect to the bending line $C_3$ is less than 30°, a crack occurred on the cover lay due to the bending.

What is claimed is:

1. A method of manufacturing a printed circuit board which is to be bent about a bending line, the method comprising:
    forming a conductor layer of an interconnection pattern on an insulating layer;
    laminating a covering layer on the insulating layer so as to expose a part of the conductor layer from the covering layer and cover the conductor layer by the covering layer;
    mechanically polishing at least the exposed portion of the conductor layer; and
    performing a plating process on the exposed portion of the conductor layer so as to form a plated layer on the conductor layer,
    wherein an angle (α) between the polishing direction of the exposed portion of the conductor layer and the bending line satisfies the following formula (1):

$$30° \leq \alpha \leq 150° \qquad (1).$$

2. The method of manufacturing the printed circuit board according to claim 1, wherein
    the printed circuit board has a plurality of bending lines, and
    the polishing direction of the exposed portion of the covering layer satisfies the formula (1) with respect to all bending lines.

3. A printed circuit board which is to be bent about a bending line, the printed circuit board comprising:
    an insulating layer;
    an interconnection pattern which is formed on the insulating layer and includes a terminal portion; and
    a covering layer which is laminated on the insulating layer so as to expose the terminal portion and cover the interconnection pattern, wherein
    a plurality of polishing flaws are formed on the surface of the covering layer, and
    an angle (β) between the polishing flaws and the bending line satisfies the following formula (2):

$$30° \leq \beta \leq 150° \qquad (2).$$

* * * * *